(12) United States Patent
Wu et al.

(10) Patent No.: US 12,538,598 B2
(45) Date of Patent: Jan. 27, 2026

(54) CHIP PACKAGE STRUCTURE AND METHOD FOR FABRICATING THE SAME

(71) Applicant: TONG HSING ELECTRONIC INDUSTRIES, LTD., Taipei (TW)

(72) Inventors: Dong-Ru Wu, Hsin-Chu County (TW); Chien-Chen Lee, Hsin-Chu County (TW); Li-Chun Hung, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 432 days.

(21) Appl. No.: 18/181,557

(22) Filed: Mar. 10, 2023

(65) Prior Publication Data

US 2024/0136376 A1   Apr. 25, 2024
US 2024/0234454 A9   Jul. 11, 2024

(30) Foreign Application Priority Data

Oct. 19, 2022 (TW) .................................. 111139588

(51) Int. Cl.
*H10F 39/00*   (2025.01)
*H01L 21/50*   (2006.01)
*H01L 23/00*   (2006.01)

(52) U.S. Cl.
CPC .......... *H10F 39/804* (2025.01); *H01L 21/50* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48105* (2013.01); *H01L 2224/48227* (2013.01); *H01L 2224/73265* (2013.01)

(58) Field of Classification Search
CPC ....... H10F 39/804; H01L 21/50; H01L 24/32; H01L 24/48; H01L 24/73; H01L 2224/32225; H01L 2224/48091; H01L 2224/48105; H01L 2224/48227; H01L 2224/73265; H01L 23/04; H01L 23/10; H01L 21/56; H01L 23/043; H01L 23/14; H01L 23/31

See application file for complete search history.

(56) References Cited

U.S. PATENT DOCUMENTS

2019/0074310 A1\*  3/2019  Chuang ................ H10F 39/809
2020/0119070 A1\*  4/2020  Yang .................... H10F 39/804

\* cited by examiner

*Primary Examiner* — Patricia D Valenzuela
(74) *Attorney, Agent, or Firm* — Li & Cai Intellectual Property Office

(57) ABSTRACT

A chip package structure and a method for fabricating the same are provided. The chip package structure includes a conductive substrate, a chip, a molding layer and a package cover. The conductive substrate has first and second board surfaces opposite to each other, and a die-bonding region is defined on the first board surface. The chip is disposed on the first board and located in the die-bonding region, and is electrically connected to the conductive substrate. The molding layer is disposed on the first board surface and surrounds the die-bonding region and the chip. The package cover is disposed on the molding layer, and the package cover, the molding layer and the conductive substrate jointly define an enclosed space surrounding the chip. Two of the conductive substrate, the molding layer and the package cover are connected to each other through a mortise-tenon joint structure.

15 Claims, 14 Drawing Sheets

CHIP PACKAGE STRUCTURE AND METHOD FOR FABRICATING THE SAME

CROSS-REFERENCE TO RELATED PATENT APPLICATION

This application claims the benefit of priority to Taiwan Patent Application No. 111139588, filed on Oct. 19, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure and a method for fabricating the same, and more particularly to a chip packaging structure and a method for fabricating the same that can improve tolerance for pre-conditioning tests.

BACKGROUND OF THE DISCLOSURE

To simulate failure conditions that packaged chip products may encounter in subsequent processes, a pre-conditioning test is performed. Therefore, in order to reproduce conditions in which the packaged chip products are exposed to the real-world environment, and to reproduce conditions in reflow processes during assembly of the packaged chip products, steps such as moisture soaking and reflow tests are necessary.

In such tests, the packaged chip products absorb moisture in the moisture soaking step, and the absorbed moisture will rapidly expand due to a rapid increase in temperature during the reflow test. Therefore, whether the packaged chip products have internal delamination and cracks due to an expansion of moisture can be determined through visual inspection and ultrasonic scanning acoustic tomography (SAT), with such internal delamination and cracks prone to causing functional abnormalities of the packaged chip products.

In addition, in the existing chip packaging technology, epoxy resin is often used to adhere a substrate to a glass cover to form an enclosed space, so as to package the chip in the enclosed space. However, when performing pre-conditioning tests for such structure, due to the epoxy resin being exposed to the air, a large amount of moisture will be absorbed during the moisture soaking step, such that cracks can easily appear during the reflow process, which indicates that the packaged chip products have low tolerance for the real-world environments.

On the other hand, for an optical sensing chip that senses external light sources, the epoxy resin cannot provide good lateral shielding when used as a side wall of the package structure, such that false sensing can easily occur due to the reflection of the glass cover.

SUMMARY OF THE DISCLOSURE

In response to the above-referenced technical inadequacies, the present disclosure provides a chip package structure and a method for fabricating the same that can reduce or eliminate occurrence of cracks in an adhesive.

In one aspect, the present disclosure provides a chip packaging structure, which includes a conductive substrate, a chip, a molding layer, and a package cover. The conductive substrate has a first board surface and a second board surface opposite to each other, and a die-bonding region is defined on the first board surface. The chip is disposed on the first board and located in the die-bonding region, and is electrically connected to the conductive substrate. The molding layer is disposed on the first board surface and surrounds the die-bonding region and the chip. The package cover is disposed on the molding layer, and the package cover, the molding layer and the conductive substrate jointly define an enclosed space surrounding the chip, such that the chip is accommodated in the enclosed space. At least two of the conductive substrate, the molding layer and the package cover are connected to each other through at least one mortise-tenon joint structure.

In another aspect, the present disclosure provides a method for fabricating a chip package structure, the method includes: providing a conductive substrate, wherein the conductive substrate has a first board surface and a second board surface opposite to each other, and a die-bonding region is defined on the first board surface; disposing a chip on the first board and in the die-bonding region, in which the chip is electrically connected to the conductive substrate; forming a molding layer on the first board surface and surrounding the die-bonding region and the chip; and disposing a package cover on the molding layer, wherein the package cover, the molding layer and the conductive substrate jointly define an enclosed space surrounding the chip, such that the chip is accommodated in the enclosed space. At least two of the conductive substrate, the molding layer and the package cover are connected to each other through at least one mortise-tenon joint structure.

Therefore, in the chip package structure and the method for fabricating the same provided by the present disclosure, since mortise-tenon joint structures are engaged in various ways to completely seal or cover the adhesives, it is possible to avoid exposing the adhesives to the air, thereby greatly reducing occurrence of cracks in the adhesives during the pre-conditioning test. In addition, the molding layer can provide better protection for the package cover, while reducing a possibility of lateral light sources entering the enclosed space.

Furthermore, in the chip package structure and the method for fabricating the same provided by the present disclosure, packaging costs can be saved, occurrence of cracks in the adhesive after the pre-conditioning test is performed can be completely avoided, and lateral light sources can be prevented from penetrating the adhesive and affecting the operation of the chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
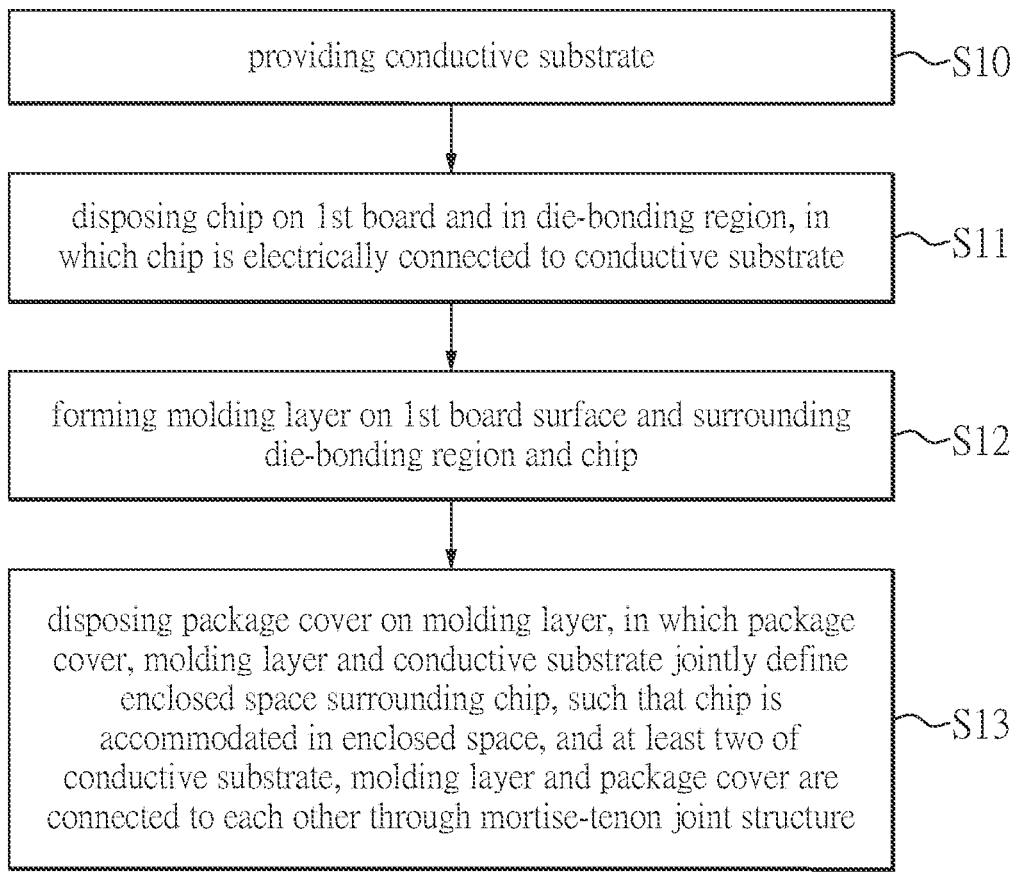
FIG. 1 is a flowchart of a method for fabricating a chip package structure according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
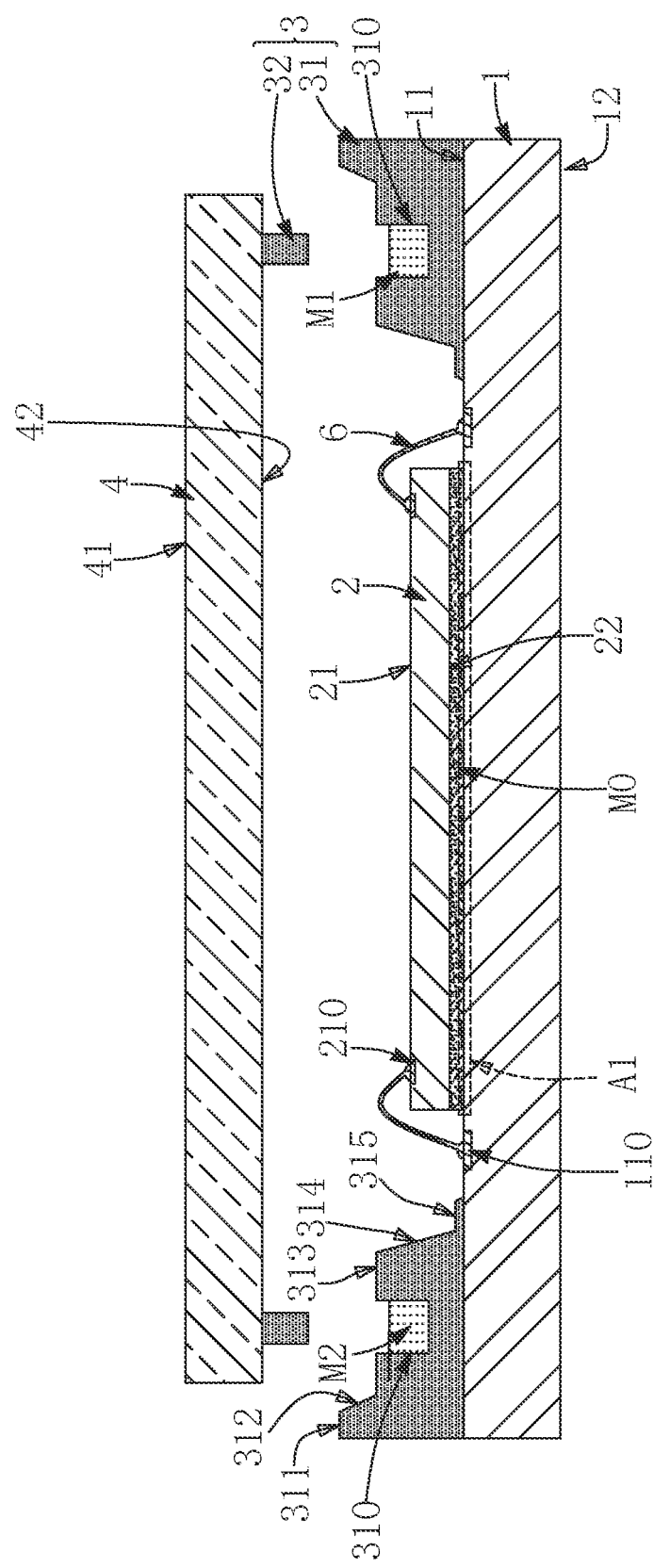
FIG. 2 is a first schematic diagram of the method for fabricating the chip package structure according to one embodiment of the present disclosure.
Figure 3:
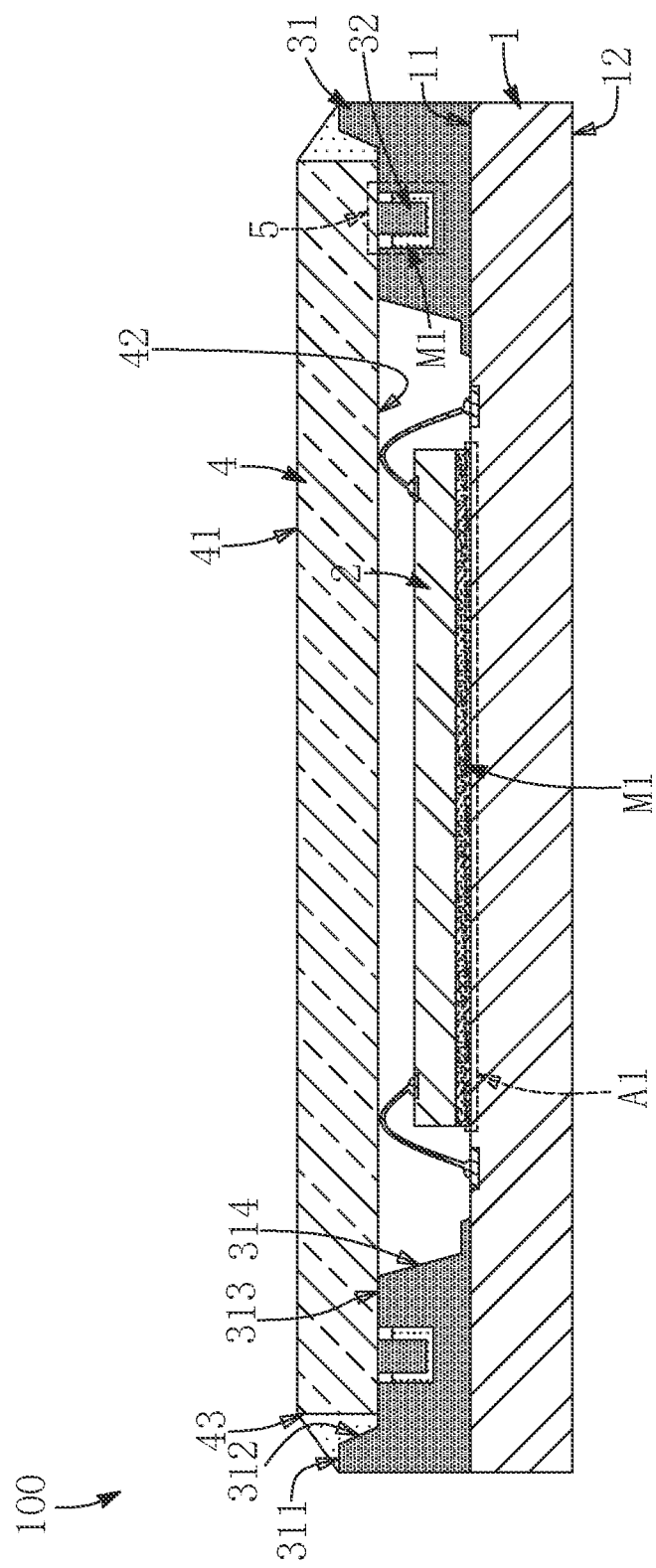
FIG. 3 is a second schematic diagram of the method for fabricating the chip package structure according to one embodiment of the present disclosure.

FIG. 1 is a flowchart of a method for fabricating a chip package structure according to one embodiment of the present disclosure, FIG. 2 is a first schematic diagram of the method for fabricating the chip package structure according to one embodiment of the present disclosure, and FIG. 3 is a second schematic diagram of the method for fabricating the chip package structure according to one embodiment of the present disclosure. As shown in FIGS. 1, 2 and 3, one embodiment of the present disclosure provides a method for fabricating a chip package structure, and the method includes the following steps:

Step S10: providing a conductive substrate. As shown in FIG. 2, the conductive substrate 1 has a first board surface 11 and a second board surface 12 opposite to each other, and a die-bonding region A1 is defined on the first board surface 11. The conductive substrate 1 can be, for example, a printed circuit board, and the conductive substrate 1 has a metal pad 110 disposed at a periphery of the die-bonding region A1.

Step S11: disposing a chip on the first board and in the die-bonding region, in which the chip is electrically connected to the conductive substrate. As shown in FIG. 2, the chip 2 can be, for example, an image sensing chip, which is arranged on the first board surface 11 and is located in the die-bonding region A1, an upper surface 21 of the chip 2 has conductive contacts 210, which can be electrically connected to metal pads 110 on the conductive substrate 1 through metal wires 6. A lower surface 22 of the chip 2 and the first board surface 11 are bonded and fixed to each other by an adhesive M0. The adhesive M0 can be, for example, thermal conductive adhesive, but the present disclosure is not limited thereto.

Step S12: forming a molding layer on the first board surface and surrounding the die-bonding region and the chip.

For example, the molding layer 3 can be formed by a molding material, such as a polymer material or a composite material, in which the polymer material can be, for example, polyimide (PI), Benzocyclobutene (BCB) or silicone, and the composite material can be, for example, glass fiber reinforced thermosetting plastics, bulk molding materials and other adhesive insulating materials or adhesive dielectric materials. The molding layer 3 can be formed by molding or injection molding. In addition, in order to achieve a good shielding effect, the molding layer 3 can be made of opaque black material, for example.

Figure 4:
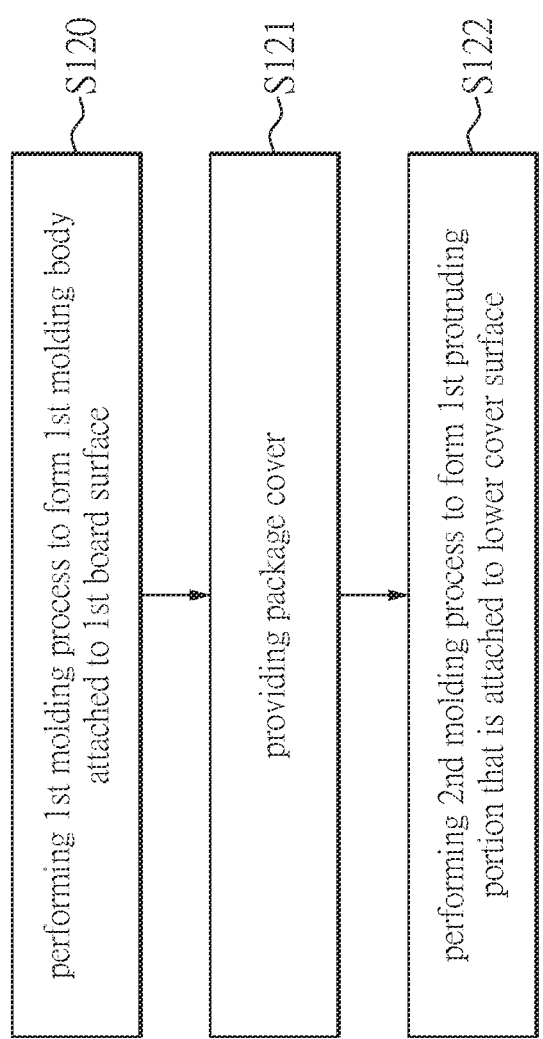
FIG. 4 is a detailed flowchart of step S12 in FIG. 1.

Reference is made to FIG. 4, is a detailed flowchart of step S12 in FIG. 1. As shown in FIG. 4, the step S12 of forming the molding layer 3 further includes:

Step S120: performing a first molding process to form a first molding body 31 attached to the first board surface 11. In this case, the first molding body 31 can be provided with a stepped structure, for example, the stepped structure includes a first plane 311, a second plane 313 and a third plane 315 from high to low, a first slope 312 is located between the first plane 311 and the second plane 313, a second slope 314 is located between the second plane 313 and the third plane 315. In addition, the first molding body 31 has a first groove 310, and the first groove 310 can be defined by the second plane 313. For example, in this step, a mold that defines the first molding body 31 can be prefabricated, and the first molding body 31 can be formed by pressing the mold on the first plate surface 11, and the first molding body 31 can be formed to surround the die-bonding region A1. It should be noted that a quantity of the first groove 310 is one or more. When the quantity of the first groove 310 is one, it can be, for example, a continuous frame-shaped groove formed around the die-bonding region A1. When there are multiple ones of the first groove 310, the first grooves 310 can be, for example, a plurality of circular or rectangular grooves formed to surround the die-bonding region A1, and the present disclosure does not limit the shape and the quantity of the first grooves 310.

Step S121: providing a package cover. As shown in FIG. 2, the package cover 4 has an upper cover surface 41 and a lower cover surface 42 facing each other, and a side cover surface 43 disposed between the upper cover surface 41 and the lower cover surface 42. The package cover 4 can be a cover made of glass, for example, but the present disclosure is not limited thereto, the package cover 4 can also be made of other transparent materials with high transmittance.

Step S122: performing a second molding process to form a first protruding portion 32 that is attached to the lower cover surface 42. Specifically, a position, a shape and a quantity of the first protruding portion 32 all correspond to those of the first groove 310, the quantity thereof can be one or more, and the first protruding portion 32 protrudes toward the first molding body 31. When the quantity of the first protruding portion 32 is one, the first protrusion may be, for example, a continuous frame-shaped protrusion formed around the area of the lower cover surface 42 corresponding to the flip chip area A1. When there are multiple ones of the first protruding portion 32, the first protruding portions 32 can be, for example, a plurality of circular or rectangular protrusions formed corresponding to the first grooves 310. In one embodiment of the present disclosure, the first groove 310 can be used to accommodate an adhesive and the first protruding portion 32 in subsequent steps; therefore, a depth of the first groove 310 needs to be greater than a height of the first protruding portion 32.

Reference is further made to FIG. 1, which shows the method for fabricating the chip package structure proceeding to step S13: disposing a package cover on the molding layer, in which the package cover, the molding layer and the conductive substrate jointly define an enclosed space surrounding the chip, such that the chip is accommodated in the enclosed space, and at least two of the conductive substrate, the molding layer and the package cover are connected to each other through at least one mortise-tenon joint structure.

Figure 5:
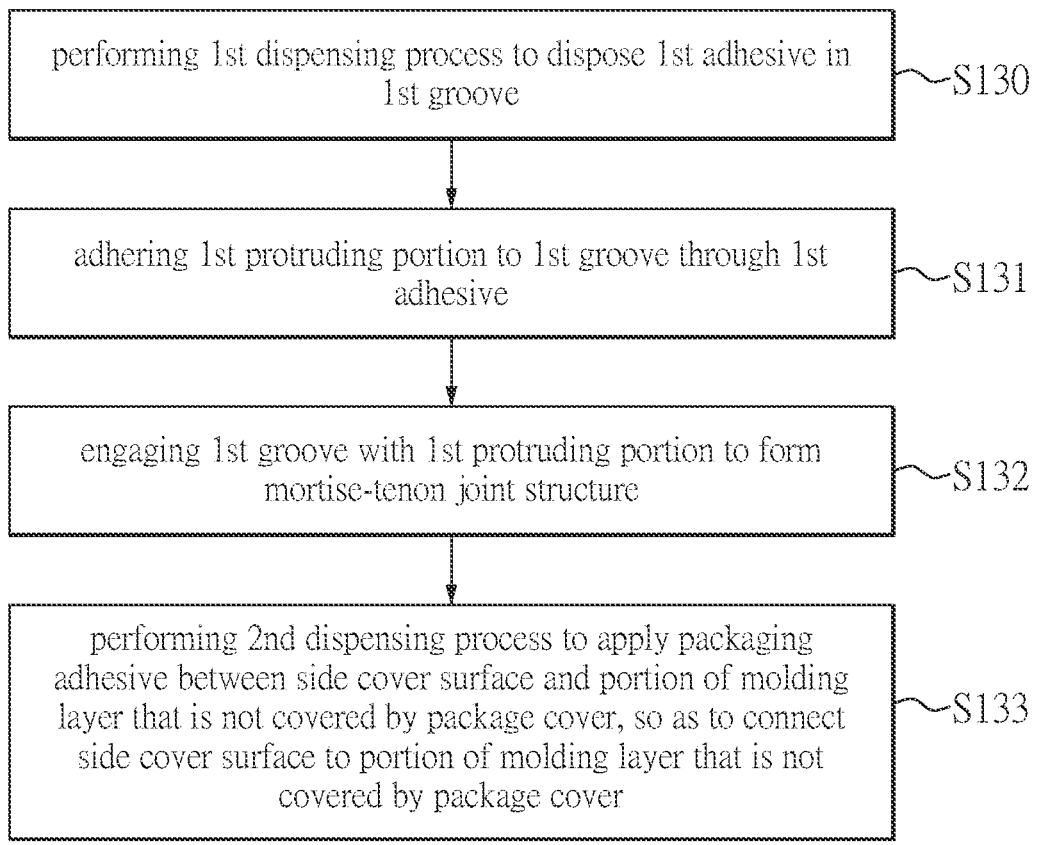
FIG. 5 is a detailed flowchart of step S13 in FIG. 1.

For example, reference can be further made to FIGS. 2, 3 and 5, and FIG. 5 is a detailed flowchart of step S13 in FIG. 1.

Step S130: performing a first dispensing process to dispose a first adhesive M1 in the first groove 30. It should be noted that when the shape of the first groove 310 is the continuous frame-shaped groove formed around the die-bonding region A1, the first adhesive M1 can be coated in the first groove 310 in a continuous manner. When multiple ones of the first groove 310 are formed in a form of a plurality of circular or rectangular grooves formed around the die-bonding region A1, the first adhesive M1 can be applied in the multiple ones of the first groove 310 by performing the dispensing process for multiple times.

Step S131: adhering the corresponding first protruding portion 32 to the first groove 310 through the first adhesive M1. The first adhesive M1 can be, for example, adhesive epoxy resin.

Step S132: engaging the first groove 310 with the first protruding portion 32 to form the mortise-tenon joint structure 5. As shown in FIG. 3, when the first groove 310 is engaged with the first protruding portion 32, the second plane 313 will abut against the lower cover surface 42, such that the first adhesive M1 is completely sealed in another enclosed space formed by the first groove 310 and the lower cover surface 42. Furthermore, since the depth of the first groove 310 is greater than the height of the first protruding portion 32, when the first groove 310 is engaged with the first protruding portion 32, the first protruding portion 32 will not come in direct contact with the corresponding first protruding portion 32, thereby preventing the package cover 4 or the first groove 310 from being damaged due to extrusion, and preventing the adhesive M1 from being over-extruded to leak out of the enclosed space.

In addition, in this embodiment, when the first groove 310 is engaged with the first protruding portion 32 correspondingly, the first slope 312 and the first plane 311 can form a blocking wall at the side cover surface 43 of the package cover 4, so as to protect the side cover surface 43 of the package cover 4. In some embodiments, the height of the first plane 311 can be the same as the height of the upper cover surface 41 to provide better protection, while light sources from a side of the chip package structure can be blocked by the blocking wall to provide better shielding. Moreover, since the first adhesive M1 is located in the first groove 310 that is spaced apart from the metal pad 110 by a predetermined distance (for example, the height of the second plane 313), the first adhesive M1 can be prevented from overflowing to the metal pad 110 during the dispensing process or a binding of the first groove 310 and the first protruding portion 32, or the first adhesive M1 can be prevented from overflowing to the second slope 314 and then spreading and contacting the metal pad 110. In some embodiments, a width of the first groove 310 can be in a range of 300 μm to 700 μm; preferably, the width of the first groove 310 can be in a range of 400 μm to 600 μm, which can ensure that the first groove 310 has sufficient space for accommodating the first adhesive M1 and the first protruding portion 32.

Step S133: performing a second dispensing process to apply a packaging adhesive between the side cover surface and a portion of the molding layer that is not covered by the package cover, so as to connect the side cover surface to the portion of the molding layer that is not covered by the package cover. It should be noted that the adhesive can be a liquid encapsulation glue, which can be provided with a solid property after being cured, so as to provide protection for a part of the side cover surface 43 and an upper surface of the molding layer 3 (for example, a part of the first surface 311, the first slope 312 and the second surface 313). Such protection can, for example, prevent external dust or particles from entering the enclosed space E1.

After step S133, the chip package structure 100 provided by one embodiment of the present disclosure is formed, and the chip package structure 100 includes the conductive substrate 1, the chip 2, the molding layer 3 and the package cover 4. Moreover, in the chip package structure 100 and the method for fabricating the same shown in FIGS. 2 to 5, since the first adhesive M1 is completely sealed in the enclosed space formed by the first groove and the lower cover surface, it becomes possible to avoid exposing the first adhesive M1 to the air, thereby greatly reducing occurrence of cracks in the first adhesive M1 during the pre-conditioning test. In addition, the stepped structure formed by the molding layer 3 can form the blocking wall to provide better protection for the package cover 4, while reducing a possibility of lateral light sources entering the enclosed space E1.

Figure 6:
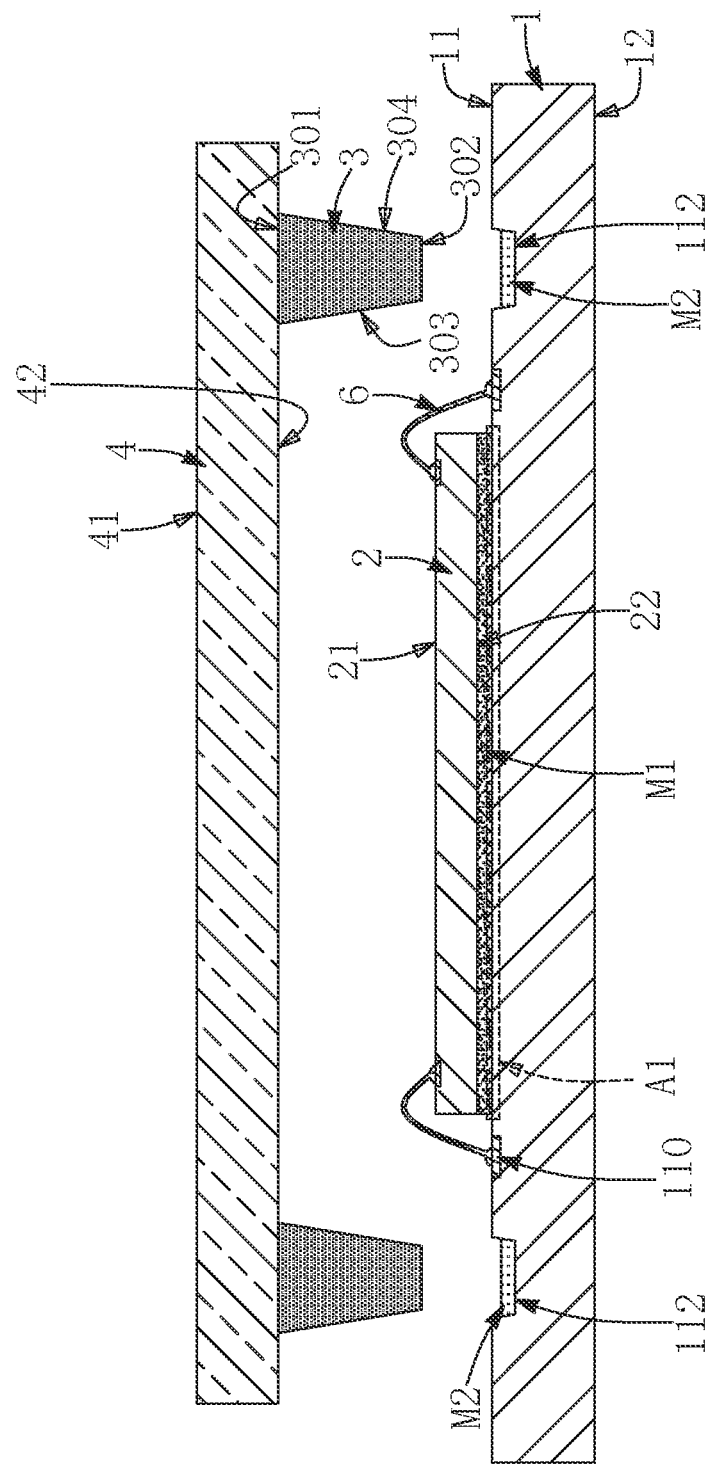
FIG. 6 is a third schematic diagram of the method for fabricating the chip package structure according to one embodiment of the present disclosure.
Figure 7:
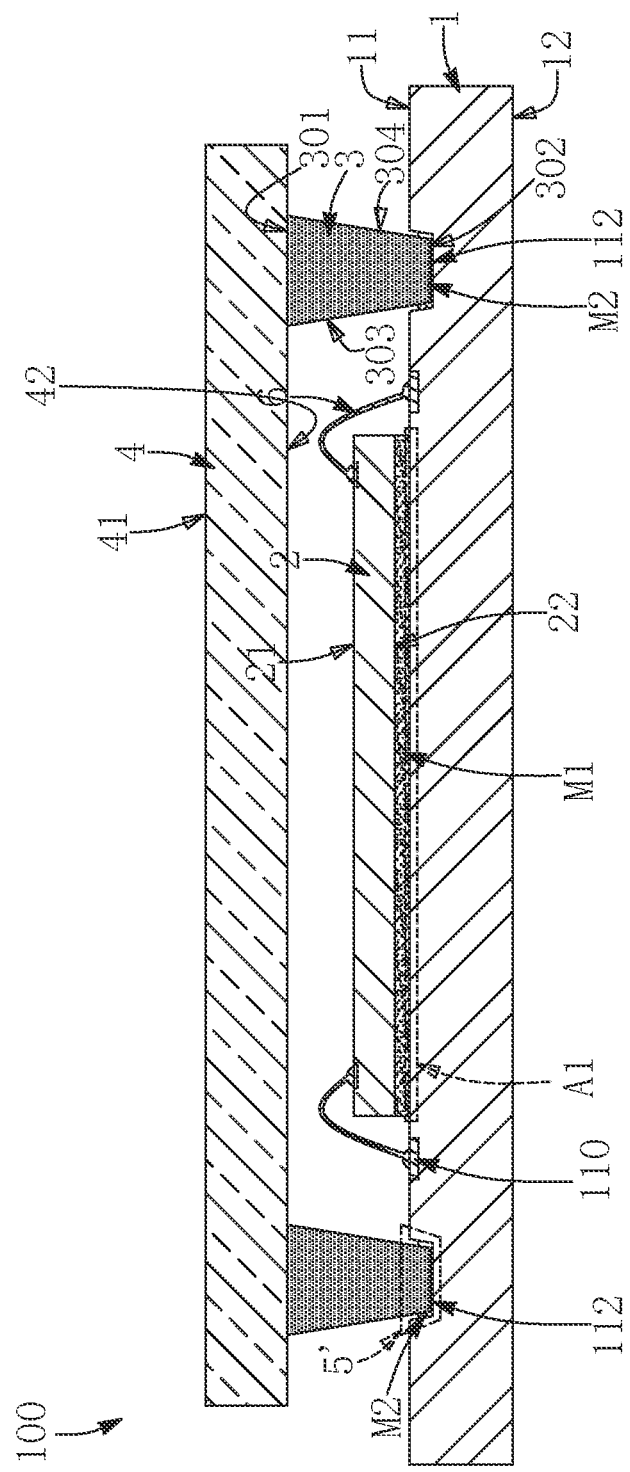
FIG. 7 is a fourth schematic diagram of the method for fabricating the chip package structure according to one embodiment of the present disclosure.

FIG. 6 is a third schematic diagram of the method for fabricating the chip package structure according to one embodiment of the present disclosure, and FIG. 7 is a fourth schematic diagram of the method for fabricating the chip package structure according to one embodiment of the present disclosure.

Reference is made to FIGS. 1, 6 and 7. In another embodiment, at least one second groove 112 is provided on the first surface 11 of the conductive substrate 1 provided in step S10. It should be noted that a quantity of the second groove 112 can also be one or more. When the quantity of the second groove 112 is one, the second groove 112 can be, for example, a continuous frame-shaped groove formed around the die-bonding region A1. When there are multiple ones of the first groove 310, the first grooves 310 can be, for example, a plurality of circular or rectangular grooves formed to surround the die-bonding region A1, and the present disclosure does not limit the shape and the quantity of the first grooves 310.

Figure 8:
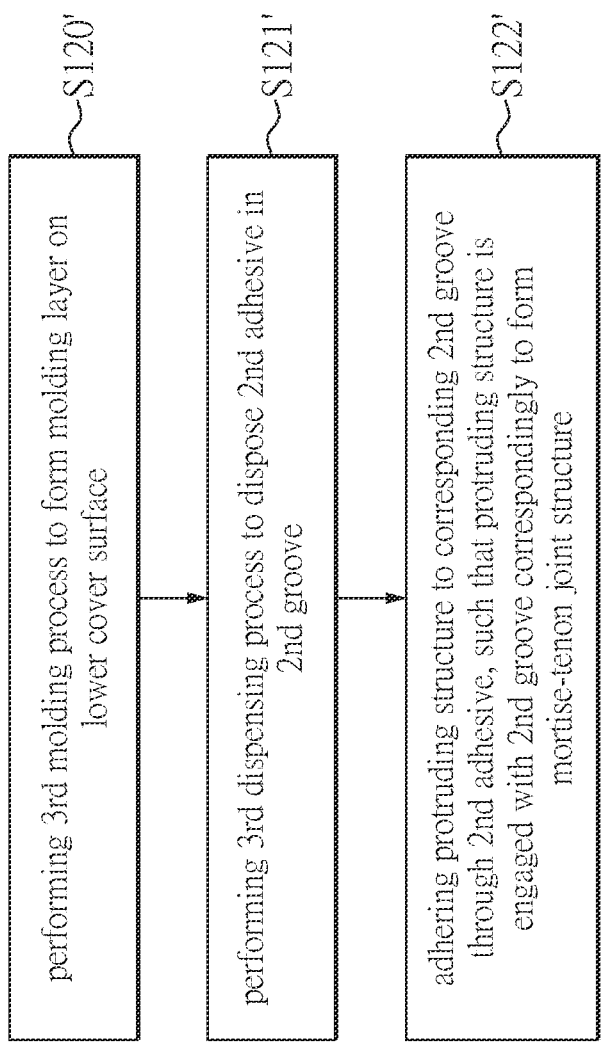
FIG. 8 is another detailed flowchart of steps S12 and S13 in FIG. 1.

Reference is made to FIG. 8, which is another detailed flowchart of steps S12 and S13 in FIG. 1.

As shown in FIG. 8, the step of forming the molding layer can include the following steps:

Step S120': performing a third molding process to form the molding layer 3 on the lower cover surface 42. As shown in FIG. 6, the molding layer 3 has an upper surface 301, a lower surface 302, and an inner surface 303 and an outer surface 304 that are arranged between the upper surface 301 and the lower surface 302 and that are opposite to each other, and the inner surface 303 faces the enclosed space E1 of FIG. 7.

It should be noted that the upper surface 301 is attached to the lower cover surface 42, and the lower surface 302 protrudes toward the conductive substrate 11 relative to the lower cover surface 42, so as to form a protruding structure corresponding to the second groove 112. Similarly, a position, a shape and a quantity of the protruding structure correspond to those of the second groove 112, and the quantity thereof can be one or more. When the quantity of the protruding structure is one, the protruding structure can be, for example, a continuous frame-shaped protrusion formed around a region of the lower cover surface 42 corresponding to the die-bonding region A1. When there are multiple ones of the protruding structure, which can be, for example, a plurality of circular or rectangular protrusions formed corresponding to the second groove 112.

Step S121': performing a third dispensing process to dispose a second adhesive M2 in the second groove 112.

Step S122': adhering the protruding structure to the corresponding second groove 112 through the second adhesive M2, such that the protruding structure is engaged with the second groove 112 correspondingly to form the mortise-tenon joint structure 5'. As shown in FIG. 7, in the mortise-tenon joint structure 5', each of the inner side surface 303 and the outer side surface 304 has a part located in the second groove 112.

After step S122', the chip package structure 100 provided by another embodiment of the present disclosure is formed. It should be noted that, in this embodiment, since the second adhesive M2 is only used for correspondingly engaging the protruding structure formed by the molding layer 3 with the second groove 112, most of the second adhesive M2 is covered by the molding layer 3, and only a very small part of the second adhesive M2 is exposed to the air. Therefore, the occurrence of cracks in the second adhesive M2 during the pre-conditioning test can also be greatly reduced. Moreover, since the second adhesive M2 is in position lower than the upper surface 21 of the chip 2, lateral light sources can also be prevented from reaching a sensing area of the upper surface 21 of the chip 2 through the transparent second adhesive M2.

In one preferred embodiment of the present disclosure, topography of the inner surface 303, the outer surface 304, and the inner surface of the second groove 112 can be designed such that when the protruding structure formed by the molding layer 3 engages with the second groove 112, the molding layer 3 will completely seal any path for the second adhesive M2 being in contact with the air, which will further reduce the occurrence of cracks during the pre-conditioning test caused by the second adhesive M2 in contact with the air.

Figure 9:
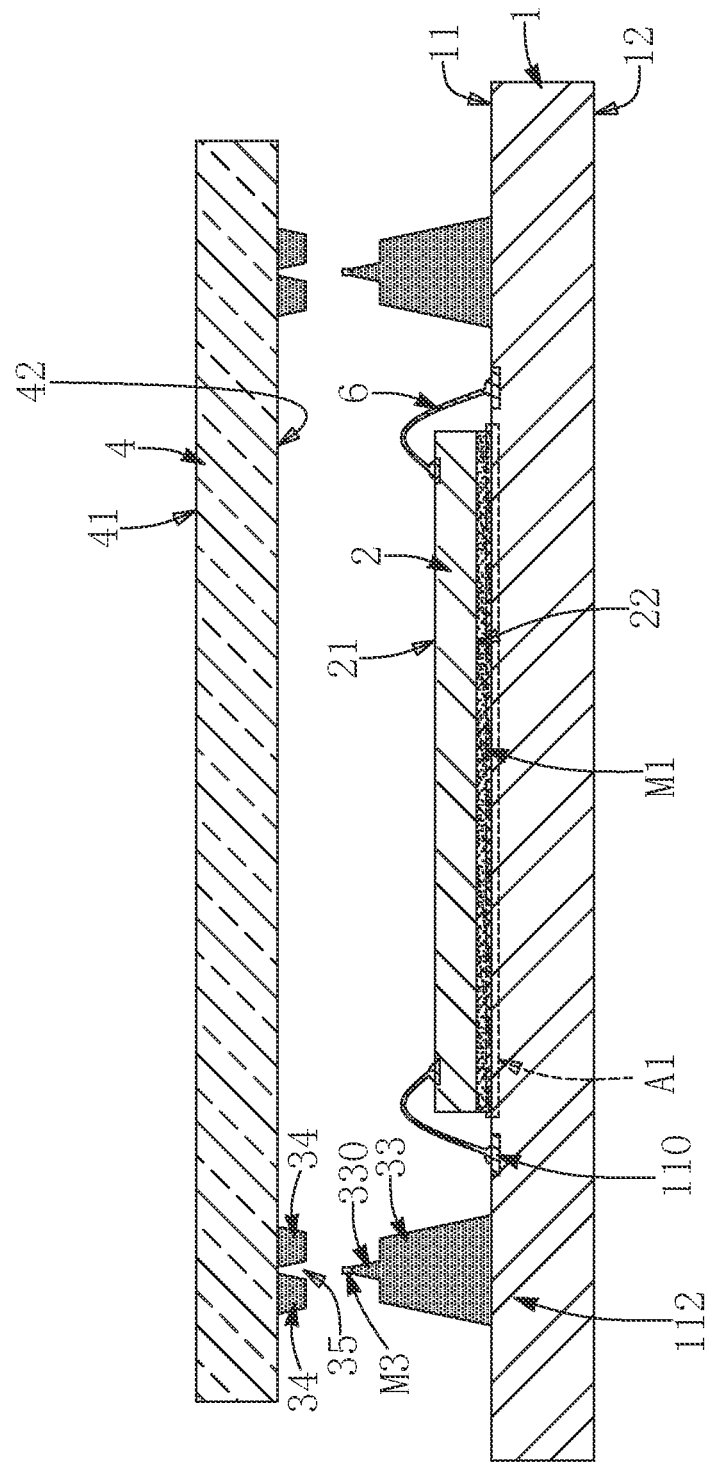
FIG. 9 is a fifth schematic diagram of the manufacturing method of the chip package structure according to the embodiment of the present disclosure.
Figure 10:
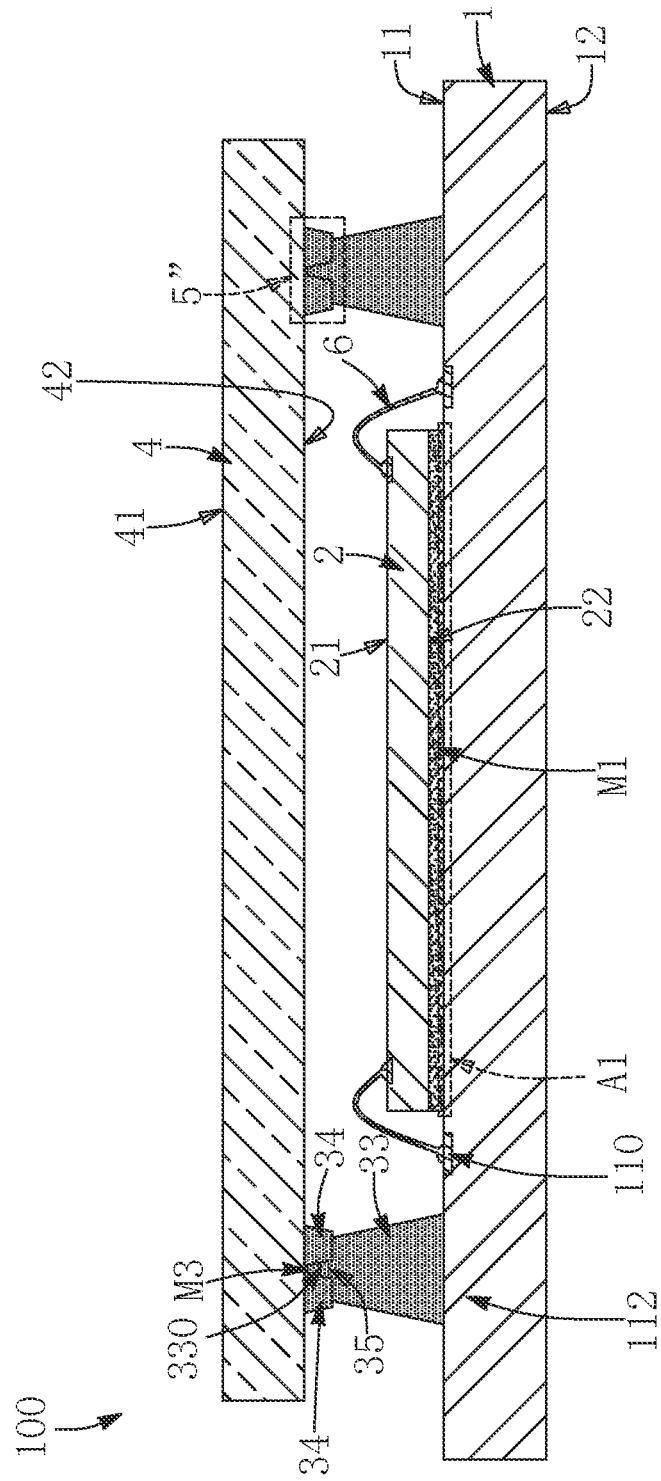
FIG. 10 is a sixth schematic diagram of the method for fabricating the chip package structure according to one embodiment of the present disclosure.
Figure 11:
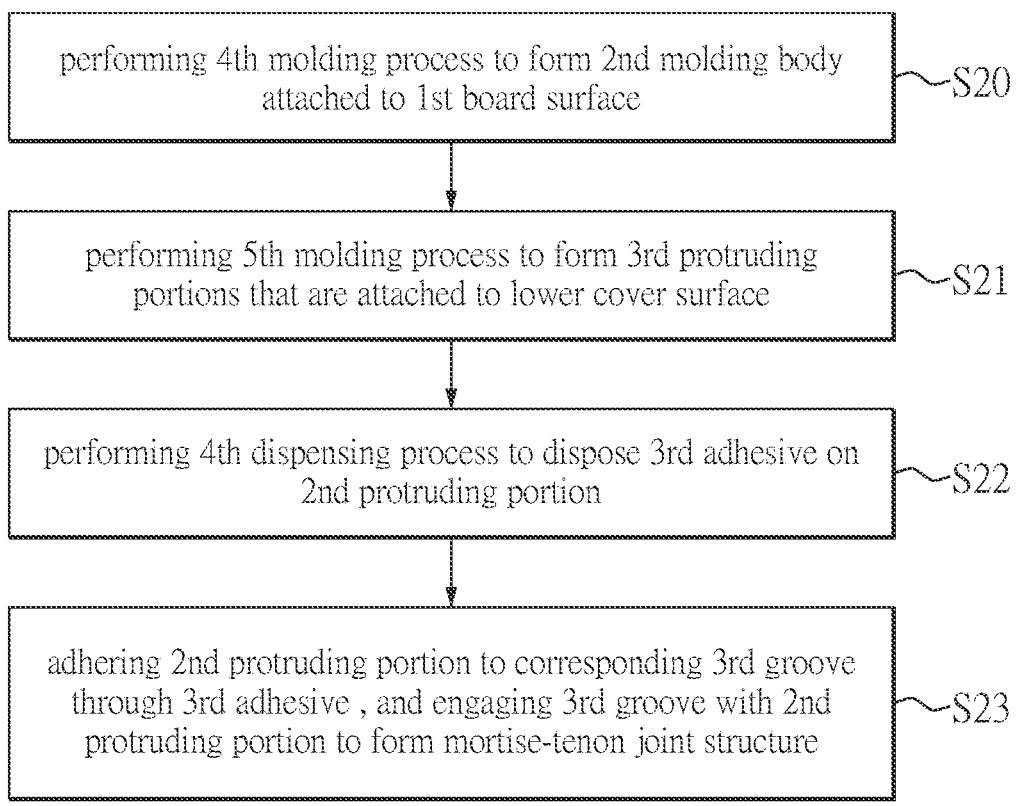
FIG. 11 is yet another detailed flowchart of steps S12 and S13 in FIG. 1.

FIG. 9 is a fifth schematic diagram of the manufacturing method of the chip package structure according to the embodiment of the present disclosure, FIG. 10 is a sixth schematic diagram of the method for fabricating the chip package structure according to one embodiment of the present disclosure, and FIG. 11 is yet another detailed flowchart of steps S12 and S13 in FIG. 1.

Reference is made to FIGS. 1 and 9 to 11. In yet another embodiment, the step S12 of forming the molding layer 3 and the step S13 of forming the chip package structure 100 further include:

Step S20: performing a fourth molding process to form a second molding body 33 attached to the first board surface 11. In this step, the second molding body 33 has a second protruding portion 330.

Step S21: performing a fifth molding process to form a plurality of third protruding portions that are attached to the lower cover surface 42. In this step, each of the third protruding portions 34 defines a third groove 35 to correspond to the second protruding portion 330. It should be noted that a quantity of the second protruding portion 330 and a quantity of the third groove 35 are corresponding to each other, and can be one or more, respectively. For example, when the quantity of the third groove 35 is one, the quantity of the second protruding portion 330 is also one, and the third groove 35 can be a continuous frame-shaped groove formed around a region corresponding to the die-bonding region A1 on the lower cover surface 42, and the second protruding portion 330 is a continuous frame-shaped protrusion formed on the second molding body 33. It should be noted that for the third groove 35, the continuous frame-shaped groove can be defined by two continuous frame-shaped protrusions formed on the inside and outside of the die-bonding region A1, or can be defined by one continuous frame-shaped protrusion.

On the other hand, when there are multiple ones of the third groove 35, the third grooves 35 can be, for example, a plurality of circular or rectangular grooves formed around the region on the lower cover surface 42 corresponding to the die-bonding region A1, while multiple ones of the second protruding portion 330 can be a plurality of circular or rectangular protrusions correspondingly formed above the second molding body 33. The present disclosure does not limit the shape and quantity of the third groove 35 and the second protruding portion 330.

Step S22: performing a fourth dispensing process to dispose a third adhesive M3 on the second protruding portion 330. The third adhesive M3 is the same as or similar to the aforementioned adhesive, and thus repetitive descriptions will be omitted hereinafter.

Step S23: adhering the second protruding portion 330 to the corresponding third groove 35 through the third adhesive M3, and engaging the third groove 35 with the second protruding portion 330 to form a mortise-tenon joint structure 5". In this embodiment, although the second protruding portion 330 and the third protruding portion 34 both have trapezoidal cross-sections, the above is only one implementation mode, and the present disclosure does not limit the cross-sections of the second protruding portion 330 and the third protruding portion 34, as long as the formed third groove 35 and the second protruding portion 330 have shapes that can complement each other and can engage with each other.

After step S23, the chip package structure 100 provided by yet another embodiment of the present disclosure is formed. It should be noted that, in this embodiment, since the third adhesive M3 is only used to engage the third groove 35 formed by the third protruding portion 34 with the second protruding portion 330 of the second molding body 33, the third adhesive M3 is sealed in the molding layer 3. Therefore, the occurrence of cracks in the third adhesive M during the pre-conditioning test can be greatly reduced. Moreover, since the third adhesive M3 is completely sealed, lateral light sources can be prevented from reaching the sensing area of the upper surface 21 of the chip 2 through the transparent third adhesive M3.

Figure 12:
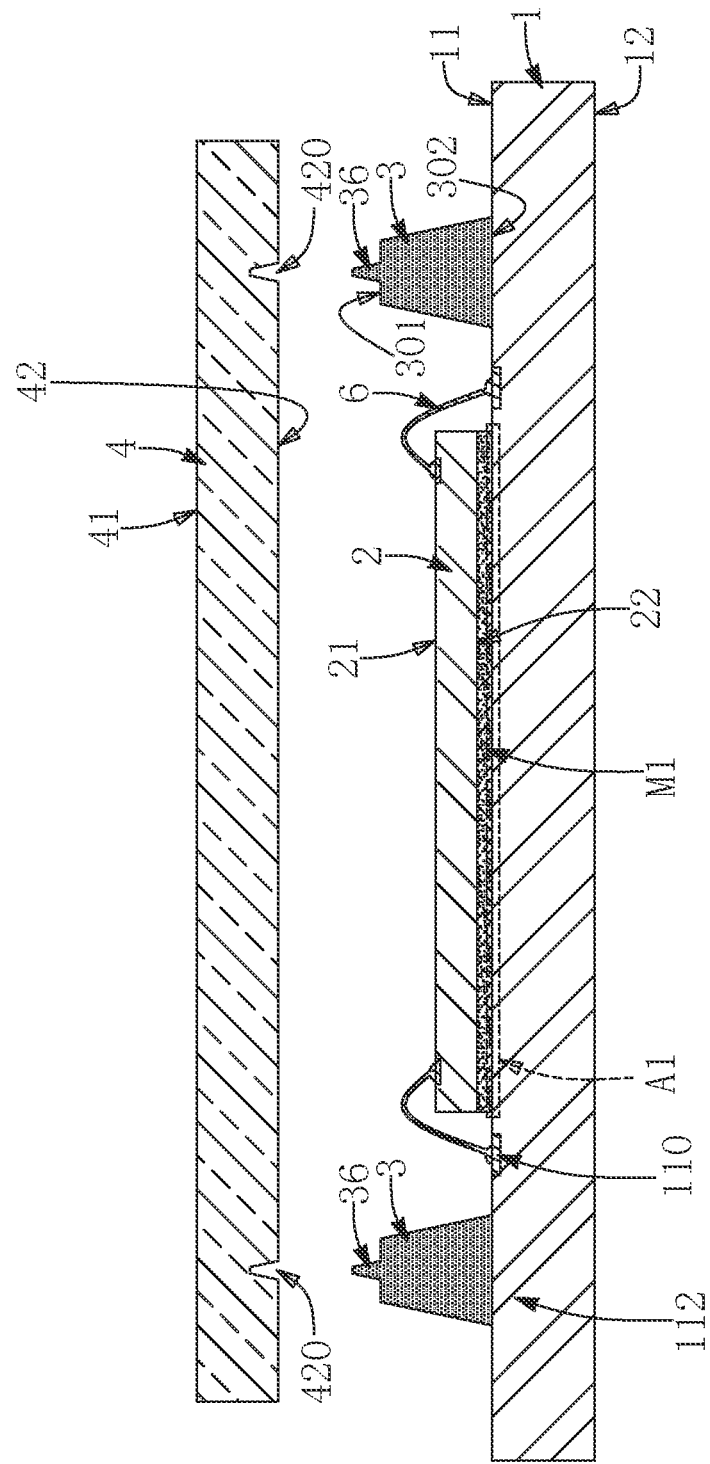
FIG. 12 is a seventh schematic diagram of the method for fabricating the chip package structure according to one embodiment of the present disclosure.
Figure 13:
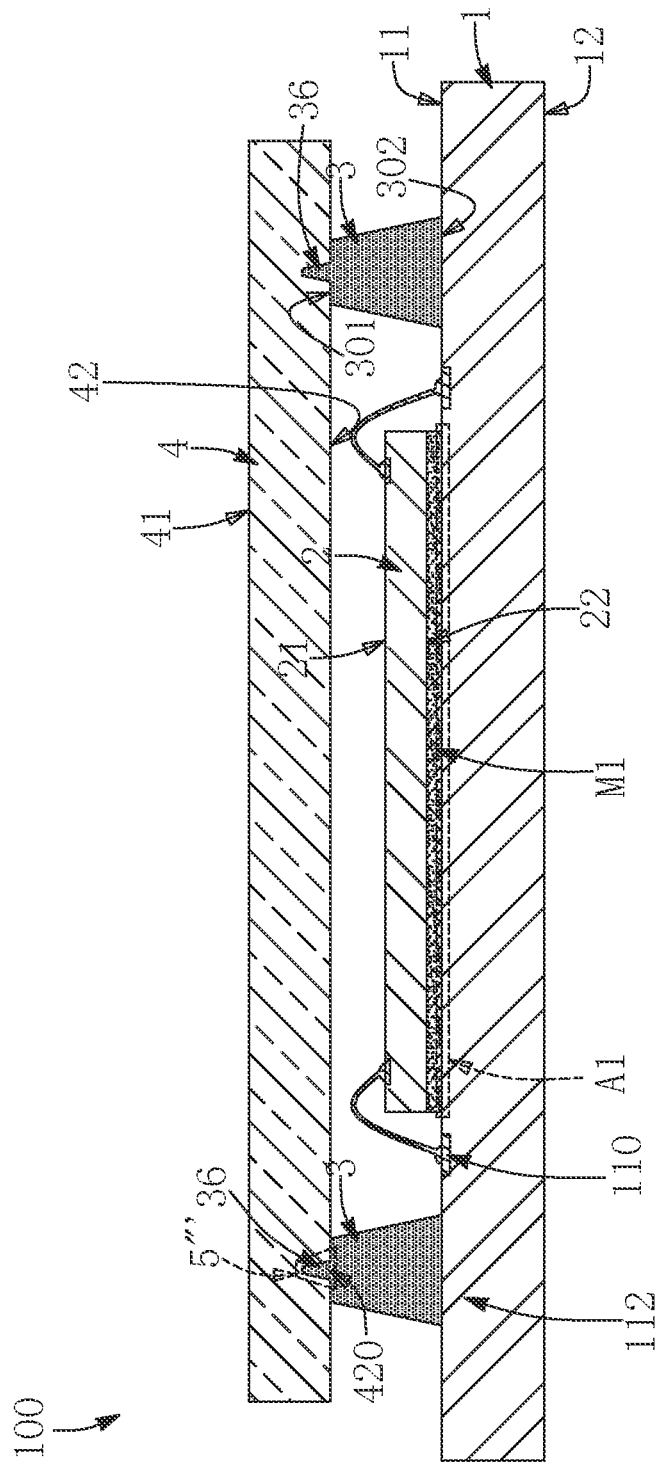
FIG. 13 is an eighth schematic diagram of the method for fabricating the chip package structure according to one embodiment of the present disclosure.
Figure 14:
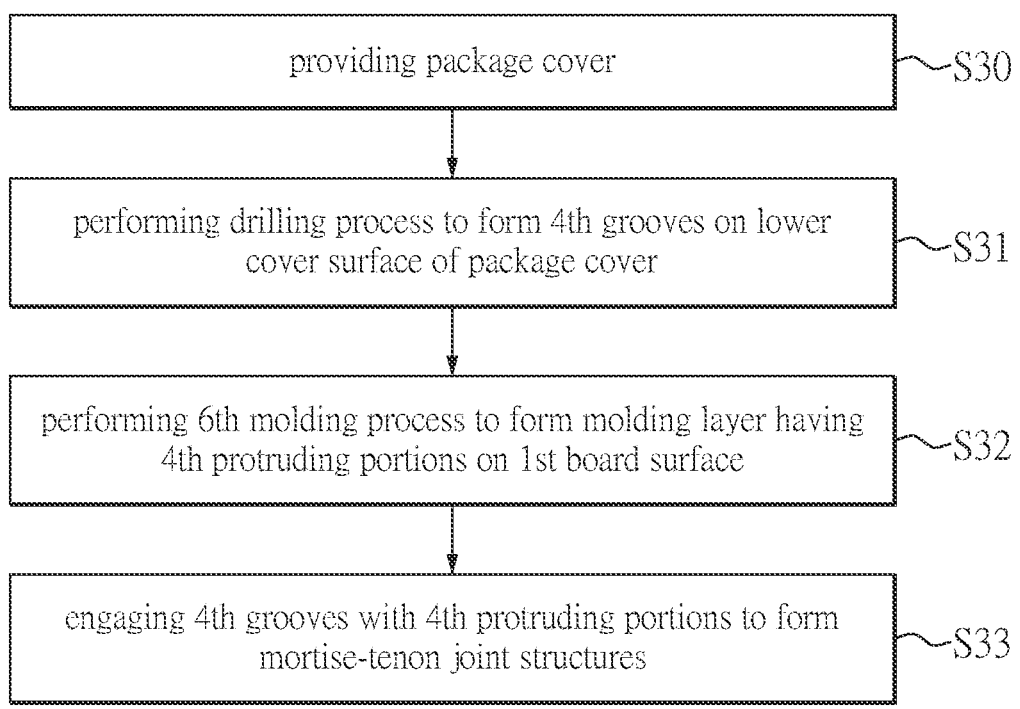
FIG. 14 is yet another detailed flowchart of steps S12 and S13 in FIG. 1.

FIG. 12 is a seventh schematic diagram of the method for fabricating the chip package structure according to one embodiment of the present disclosure, FIG. 13 is an eighth schematic diagram of the method for fabricating the chip package structure according to one embodiment of the present disclosure, and FIG. 14 is yet another detailed flowchart of steps S12 and S13 in FIG. 1.

Reference is made to FIGS. 1, 12 and 14 together. In yet another embodiment, the step S12 of forming the molding layer 3 and the step S13 of forming the chip packaging structure 100 further include:

Step S30: providing a package cover.

Step S31: performing a drilling process to form a plurality of fourth grooves 420 on the lower cover surface 42 of the package cover 4. For example, the drilling process can be performed by a drilling device for a glass substrate.

Step S32: performing a sixth molding process to form the molding layer 3 having fourth protruding portions 36 on the first board surface 11. Similar to the foregoing embodiments, the molding layer 3 has an upper surface 301 and a lower surface 302 opposite to each other, the lower surface 302 is attached to the first board surface 11, and the fourth protruding portions 36 corresponding to the fourth grooves 420 are formed on the upper surface 301. In this embodiment, quantities of the fourth protrusions 36 and the fourth grooves 420 can be plural.

Step S33: engaging the fourth grooves 420 with the fourth protruding portions 36 to form mortise-tenon joint structures 5". In this embodiment, although the fourth grooves 420 and the fourth protruding portions 36 are engaged with each other with trapezoidal cross-sections, the above describes only one mode of implementation, and the present disclosure does not limit the shapes or sizes of the cross-sections of the fourth grooves and the fourth protruding portions 36, as long as the formed fourth grooves 420 and the fourth protruding portions 36 have shapes that can complement each other and can engage with each other. In addition, although the fourth grooves 420 in FIG. 12 do not completely penetrate the package cover 4, in one preferred embodiment, the fourth grooves 420 can completely penetrate the package cover 4, thereby providing a stronger binding during the engagement of the grooves 420 and the fourth protruding portions 36, and providing better stability for the combined molding layer 3 and packaging cover 4.

In addition, since this embodiment does not use any adhesive to combine any two of the conductive substrate 1, the molding layer 3 and the package cover 4, packaging costs can be saved, and occurrence of cracks in the adhesive after the pre-conditioning test is performed can be completely removed. In addition, the issue that the lateral light sources penetrate the adhesive and affect an operation of the chip 2 is completely addressed.

Beneficial Effects of the Embodiments

In conclusion, in the chip package structure and the method for fabricating the same provided by the present disclosure, since mortise-tenon joint structures engaged in various ways are formed to completely seal or cover the adhesives, it is possible to avoid exposing the adhesives to the air, thereby greatly reducing occurrence of cracks in the adhesives during the pre-conditioning test. In addition, the molding layer can provide better protection for the package cover, while reducing a possibility of lateral light sources entering the enclosed space.

Furthermore, in the chip package structure and the method for fabricating the same provided by the present disclosure, packaging costs can be saved, occurrence of cracks in the adhesive after the pre-conditioning test is performed can be completely removed, and the issue that the lateral light sources penetrate the adhesive and affect the operation of the chip can be completely addressed.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip package structure, comprising:
   a conductive substrate having a first board surface and a second board surface opposite to each other, wherein a die-bonding region is defined on the first board surface;
   a chip disposed on the first board and located in the die-bonding region, wherein the chip is electrically connected to the conductive substrate;
   a molding layer disposed on the first board surface and surrounding the die-bonding region and the chip, wherein the molding layer has a groove that is recessed in an upper surface thereof; and
   a package cover including:
      a transparent plate having an upper cover surface and a lower cover surface that is opposite to the upper cover surface; and
      a protrusion formed on the lower cover surface of the transparent plate;
   wherein the transparent plate is disposed onto the upper surface of the molding layer, and the protrusion is inserted into the groove, wherein a gap exists between the protrusion and the groove and is filled with an adhesive, and the molding layer, wherein the package cover, the molding layer and the conductive substrate jointly define an enclosed space surrounding the chip, and the chip is accommodated in the enclosed space, wherein the molding layer and the package cover are fixed to each other through the adhesive that connects the groove and the protrusion.

2. The chip package structure according to claim 1, wherein the molding layer has a blocking wall arranged on the upper surface, and the blocking wall surrounds the transparent plate and is free from contacting the transparent plate.

3. The chip package structure according to claim 2, further comprising an encapsulant filled between the blocking wall and the transparent plate, wherein the blocking wall has a plane and a slop that is connected to the plane and the upper surface, and the plane and the slop are covered by the encapsulant.

4. The chip package structure according to claim 1, wherein the protrusion does not directly contact the groove.

5. The chip packaging structure according to claim 1, wherein the package cover further includes a side cover surface disposed between the upper cover surface and the lower cover surface, and the side cover surface is connected, through a packaging adhesive, to a portion of the molding layer that is not covered by the package cover.

6. The chip package structure according to claim 1, wherein the molding layer has an upper surface and a lower surface, and an inner side surface, and an outer side surface, and wherein the inner side surface the outer side surface are disposed between the upper surface and the lower surface and are opposite to each other, and the inner side surface faces the enclosed space.

7. The chip package structure according to claim 6, wherein the molding layer has a film portion arranged on the inner side surface, and the film portion is disposed on the first board surface, and wherein the chip is bonded to the first board surface through another adhesive that is thicker than the film portion.

8. A chip package structure, comprising:
a conductive substrate having a first board surface and a second board surface opposite to each other, wherein a die-bonding region is defined on the first board surface, and the conductive substrate has a groove that is recessed in the first board surface outside of the die-bonding region;
a chip disposed on the first board and located in the die-bonding region, wherein the chip is electrically connected to the conductive substrate; and
a package cover including:
a transparent plate having an upper cover surface and a lower cover surface that is opposite to the upper cover surface; and
a protrusion formed on the lower cover surface of the transparent plate;
wherein the package cover is disposed onto the conductive substrate through the protrusion inserted into the groove, wherein a gap exists between the protrusion and the groove and is filled with an adhesive, and wherein the package cover and the conductive substrate jointly define an enclosed space surrounding the chip, such that the chip is accommodated in the enclosed space,
wherein the conductive substrate and the package cover are fixed to each other through the adhesive that connects the groove and the protrusion.

9. The chip package structure according to claim 8, wherein the protrusion is tapered in a direction away from the transparent plate.

10. The chip package structure according to claim 8, wherein an end of the protrusion arranged in the groove is lower than the chip with respect to the first board surface.

11. A chip package structure, comprising:
a conductive substrate having a first board surface and a second board surface opposite to each other, wherein a die-bonding region is defined on the first board surface;
a chip disposed on the first board and located in the die-bonding region, wherein the chip is electrically connected to the conductive substrate;
a molding layer disposed on the first board surface and surrounding the die-bonding region and the chip, wherein the molding layer has a protruding portion arranged on a top side thereof; and
a package cover having a groove, wherein the package cover is disposed on the top side of the molding layer, and the protruding portion is inserted into the groove, wherein a gap exists between the protruding portion and the groove and is filled with an adhesive, and wherein the package cover, the molding layer and the conductive substrate jointly define an enclosed space surrounding the chip, such that the chip is accommodated in the enclosed space,
wherein the molding layer and the package cover are fixed to each other through the adhesive that connects the groove and the protruding portion.

12. The chip package structure according to claim 11, wherein the package cover includes:
a transparent plate having an upper cover surface and a lower cover surface that is opposite to the upper cover surface; and
a protrusion formed on the lower cover surface of the transparent plate, wherein the groove is recessed in the protrusion;
wherein the package cover is disposed onto the top side of the molding layer, and the protruding portion is inserted into the groove of the protrusion.

13. The chip package structure according to claim 11, wherein the protruding portion is tapered in a direction away from the first board surface.

14. The chip package structure according to claim 11, wherein the package cover includes a transparent plate having an upper cover surface and a lower cover surface that is opposite to the upper cover surface, and wherein the groove is recessed in the lower cover surface of the transparent plate.

15. The chip package structure according to claim 14, wherein the groove is tapered in a direction away from the lower cover surface.

* * * * *